(12) United States Patent
Rogers

(10) Patent No.: US 10,403,480 B2
(45) Date of Patent: Sep. 3, 2019

(54) DURABLE 3D GEOMETRY CONFORMAL ANTI-REFLECTION COATING

(71) Applicant: Apple Inc., Cupertino, CA (US)

(72) Inventor: Matthew S. Rogers, San Jose, CA (US)

(73) Assignee: Apple Inc., Cupertino, CA (US)

( * ) Notice: Subject to any disclaimer, the term of this patent is extended or adjusted under 35 U.S.C. 154(b) by 83 days.

(21) Appl. No.: 15/616,839

(22) Filed: Jun. 7, 2017

(65) Prior Publication Data

US 2017/0271130 A1 Sep. 21, 2017

Related U.S. Application Data

(60) Division of application No. 14/497,077, filed on Sep. 25, 2014, now abandoned, which is a continuation of
(Continued)

(51) Int. Cl.
*H01J 37/32* (2006.01)
*C23C 14/00* (2006.01)
(Continued)

(52) U.S. Cl.
CPC .... *H01J 37/32596* (2013.01); *C23C 14/0021* (2013.01); *C23C 14/0036* (2013.01); *C23C 14/3407* (2013.01); *C23C 14/3464* (2013.01); *C23C 14/542* (2013.01); *C23C 16/455* (2013.01); *C23C 16/458* (2013.01); *C23C 16/50* (2013.01); *C23C 16/52* (2013.01); *C23C 28/04* (2013.01); *G02B 1/113* (2013.01); *H01J 37/32403* (2013.01); *H01J 37/32541* (2013.01); *H01J 37/32614* (2013.01); *H01J 37/342* (2013.01); *H01J 37/3417* (2013.01); *H01J 37/3423* (2013.01); *H01J 37/3435* (2013.01); *H01J 2237/006* (2013.01);
(Continued)

(58) Field of Classification Search
CPC .................................................. C23C 14/3464
See application file for complete search history.

(56) References Cited

U.S. PATENT DOCUMENTS 5,009,920 A 4/1991 Lee
5,876,838 A 3/1999 Mallon
(Continued)

FOREIGN PATENT DOCUMENTS

CN 1331836 A 1/2002

OTHER PUBLICATIONS

International Search Report & Written Opinion dated Jun. 10, 2015 for PCT/US2014/057424.

*Primary Examiner* — Joseph A Miller, Jr.
(74) *Attorney, Agent, or Firm* — David K. Cole

(57) ABSTRACT

Methods and systems for depositing a thin film are disclosed. The methods and systems can be used to deposit a film having a uniform thickness on a substrate surface that has a non-planar three-dimensional geometry, such as a curved surface. The methods involve the use of a deposition source that has a shape in accordance with the non-planar three-dimensional geometry of the substrate surface. In some embodiments, multiple layers of films are deposited onto each other forming multi-layered coatings. In some embodiments, the multi-layered coatings are antireflective (AR) coatings for windows or lenses.

18 Claims, 14 Drawing Sheets

Related U.S. Application Data application No. PCT/US2014/057424, filed on Sep. 25, 2014.

(51) Int. Cl.

| | |
|---|---|
| *C23C 14/34* | (2006.01) |
| *C23C 16/455* | (2006.01) |
| *C23C 16/458* | (2006.01) |
| *C23C 16/50* | (2006.01) |
| *H01J 37/34* | (2006.01) |
| *C23C 14/54* | (2006.01) |
| *C23C 16/52* | (2006.01) |
| *G02B 1/113* | (2015.01) |
| *C23C 28/04* | (2006.01) |

(52) U.S. Cl.
CPC ... *H01J 2237/081* (2013.01); *H01J 2237/327* (2013.01); *H01J 2237/3321* (2013.01)

(56) References Cited

U.S. PATENT DOCUMENTS

| | | | |
|---|---|---|---|
| 6,066,826 A | 5/2000 | Yializis | |
| 6,397,776 B1 * | 6/2002 | Yang | C23C 16/401 |
| | | | 118/719 |
| 6,528,947 B1 | 3/2003 | Chen et al. | |
| 8,932,495 B1 | 1/2015 | Nguyen et al. | |
| 2006/0054496 A1 | 3/2006 | Zhang et al. | |
| 2007/0029188 A1 | 2/2007 | Gorokhovsky | |
| 2008/0305246 A1 | 12/2008 | Choi et al. | |
| 2009/0280268 A1 | 11/2009 | Glukhoy et al. | |
| 2011/0076422 A1 | 3/2011 | Stowell | |

* cited by examiner

DURABLE 3D GEOMETRY CONFORMAL ANTI-REFLECTION COATING

CROSS-REFERENCE TO RELATED APPLICATION

This application is a divisional of U.S. patent application Ser. No. 14/497,077, filed Sep. 25, 2014, which is a continuation of international application No. PCT/US14/57424, filed Sep. 25, 2014, both of which are hereby incorporated by reference herein in their entireties.

FIELD

This disclosure relates generally to anti-reflective (AR) coatings and methods for forming the same. In particular embodiments, systems and methods for forming AR coatings on surfaces having three-dimensional geometries, such as curved surfaces, are described.

BACKGROUND

Anti-reflective (AR) coatings are generally applied to surfaces of lenses or windows to reduce the reflection of light incident on the surfaces that can cause glare. Typically, the AR coatings are thin films structures that are applied to surfaces using deposition techniques such as sputter deposition, chemical vapor deposition (CVD) and plasma enhanced chemical vapor deposition (PECVD) processes. In some cases, the AR coatings include multiple alternating layers of thin films, which provide materials of different refractive indexes and that improve the anti-reflective qualities of the AR coatings.

In some applications, the surface of a lens or a window has a three-dimensional geometry that makes applying a uniformly thick AR coating difficult. In some applications, CVD processes can offer the ability to conformally coat three-dimensional geometry parts. This is because CVD deposition of thin films occurs due to a chemical reaction at the surface of a part, while some other deposition technologies involve physical or chemical reaction in the gas phase and transport of chemical species to the substrate. However, many films formed using traditional CVD techniques are not adequately dense or durable for certain applications, such as AR coatings for exterior surfaces of consumer products.

SUMMARY

This paper describes various embodiments that relate to anti-reflective (AR) coatings and methods for forming the same. The systems and methods described are used to form AR coatings on curved surfaces or surfaces otherwise having three-dimensional geometries.

According to one embodiment, a method of depositing a film on a curved surface of a substrate is described. The method includes positioning the curved surface with respect to a source of a deposition system. The source includes an effective surface having a curved shape in accordance with the curved surface of the substrate. The method also includes causing the source to emit particles such that the particles become deposited on the curved surface as the film. The curved shape of the effective surface is associated with a thickness uniformity of the film.

According to another embodiment, a deposition system for depositing a film on a surface of a substrate is described. The surface is characterized as having a non-planar shape. The deposition system includes a source that has an effective surface configured to emit particles. The effective surface has a non-planar shape in accordance with the non-planar shape of the surface of the substrate. The deposition system also includes a support configured to position the substrate with respect to the source such that the particles emitted from the source deposit as the film on the surface of the substrate. The non-planar shape of the effective surface is associated with a thickness uniformity of the film.

According to a further embodiment, a plasma enhanced chemical vapor deposition (PECVD) apparatus for depositing a film on a curved surface of a substrate is described. The PECVD apparatus includes a hollow cathode source that has an effective surface configured to emit ions. The effective surface has a curved shape in accordance with a curved shape of the curved surface of the substrate. The PECVD apparatus also includes a support configured to position the substrate with respect to the hollow cathode source such that the ions emitted from the source deposit as the film on the curved surface of the substrate. The curved shape of the effective surface is associated with a thickness uniformity of the film.

These and other embodiments will be described in detail below.

BRIEF DESCRIPTION OF THE DRAWINGS

The disclosure will be readily understood by the following detailed description in conjunction with the accompanying drawings, wherein like reference numerals designate like structural elements, and in which.

DETAILED DESCRIPTION

Reference will now be made in detail to representative embodiments illustrated in the accompanying drawings. It should be understood that the following descriptions are not intended to limit the embodiments to one preferred embodiment. To the contrary, they are intended to cover alternatives, modifications, and equivalents as can be included within the spirit and scope of the described embodiments as defined by the appended claims.

Described herein are methods and systems for depositing a thin film on a substrate surface that has a three-dimensional geometry such that the resulting film is conformally deposited on the three-dimensional geometry and has a substantially uniform thickness. The methods involve designing a deposition source that mimics the three-dimensional surface geometry of the substrate. The deposition source can be positioned at a suitable distance to result in conformal coating on the three-dimensional surface geometry of the substrate. In some cases, multiple layers of films are deposited onto each other forming multi-layered coatings. In some embodiments, the multi-layered coatings are antireflective (AR) coatings for windows or lenses.

According to some embodiments, a sputtering system is used and the deposition source corresponds to a sputter target. According to other embodiments, a plasma enhanced chemical vapor deposition (PECVD) system is used and the deposition source corresponds to an ion source. In one specific example, a hollow cathode source as part of a PECVD system capable of depositing $Si_3N_4$ and $SiO_2$ is used. Traditionally, this is done with a planar-shaped source, resulting in a film having a non-uniform thickness. Embodiments herein describe a source with an effective surface that has a curvature similar to the curvature of surface of substrate. In another specific example, a system of multiple sputtering sources angled appropriately to coat an entire three-dimensional geometry of a substrate surface is described. Additionally, translation and/or rotation of the substrate during coating can be implemented to smooth out any non-uniformities.

Methods described herein are well suited for providing AR coatings on surfaces of consumer products. For example, the methods described herein can be used to form durable and effective AR coatings for portions of computers, portable electronic devices and electronic device accessories, such as those manufactured by Apple Inc., based in Cupertino, Calif. In some embodiments, the methods described herein can be used to form AR coatings on curved surfaces, such as curved windows or lenses of consumer electronic devices.

These and other embodiments are discussed below with reference to FIGS. 1-10. However, those skilled in the art will readily appreciate that the detailed description given herein with respect to these Figures is for explanatory purposes only and should not be construed as limiting.

Figure 1A:
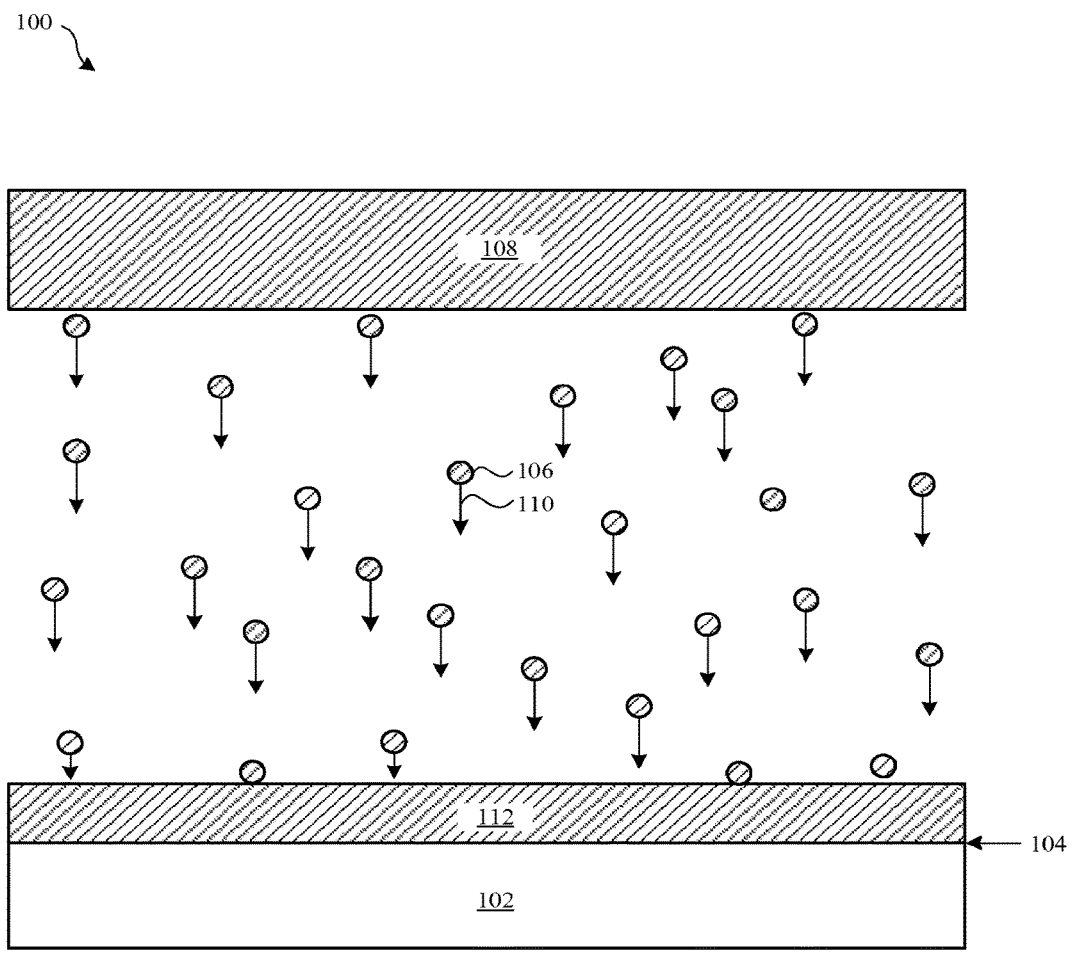
FIG. 1A shows a schematic view of a conventional deposition system used to deposit a film on a planar surface.

As described above, conventional methods for forming AR coatings are designed for forming the AR coatings on flat or planar surfaces. FIG. 1A shows a schematic view of system 100 used to deposit an AR coating on a planar surface using a conventional thin film deposition technique. During a deposition process, substrate 102 is positioned within deposition system 100. Deposition system 100 can correspond to, for example, a sputter deposition system or a chemical vapor deposition (CVD) system, such as a plasma enhanced chemical vapor deposition (PECVD) system. Substrate 102 has surface 104 that is substantially flat or planar in shape. Particles 106 from source 108 move toward and deposit onto surface 104 of substrate 102 as film 112. Arrows 110 indicate a general direction in which particles 106 move toward substrate 102 during a deposition process. As shown, particles 106 move primarily in a substantially perpendicular direction with respect to surface 104.

In cases where system 100 is a sputter deposition system, source 108 corresponds to a sputter target from which particles 106 are sputtered. In cases where system 100 is a CVD system, source 108 corresponds to a source of volatile material or precursor material that flows toward and deposits onto surface 104. In a PECVD system, particles 106 correspond to ions and/or other reactive chemical species within a plasma. Using system 100, film 112 can be deposited on surface 104 uniformly. That is, the thickness of film 112 can be about the same across surface 104.

Figure 1B:
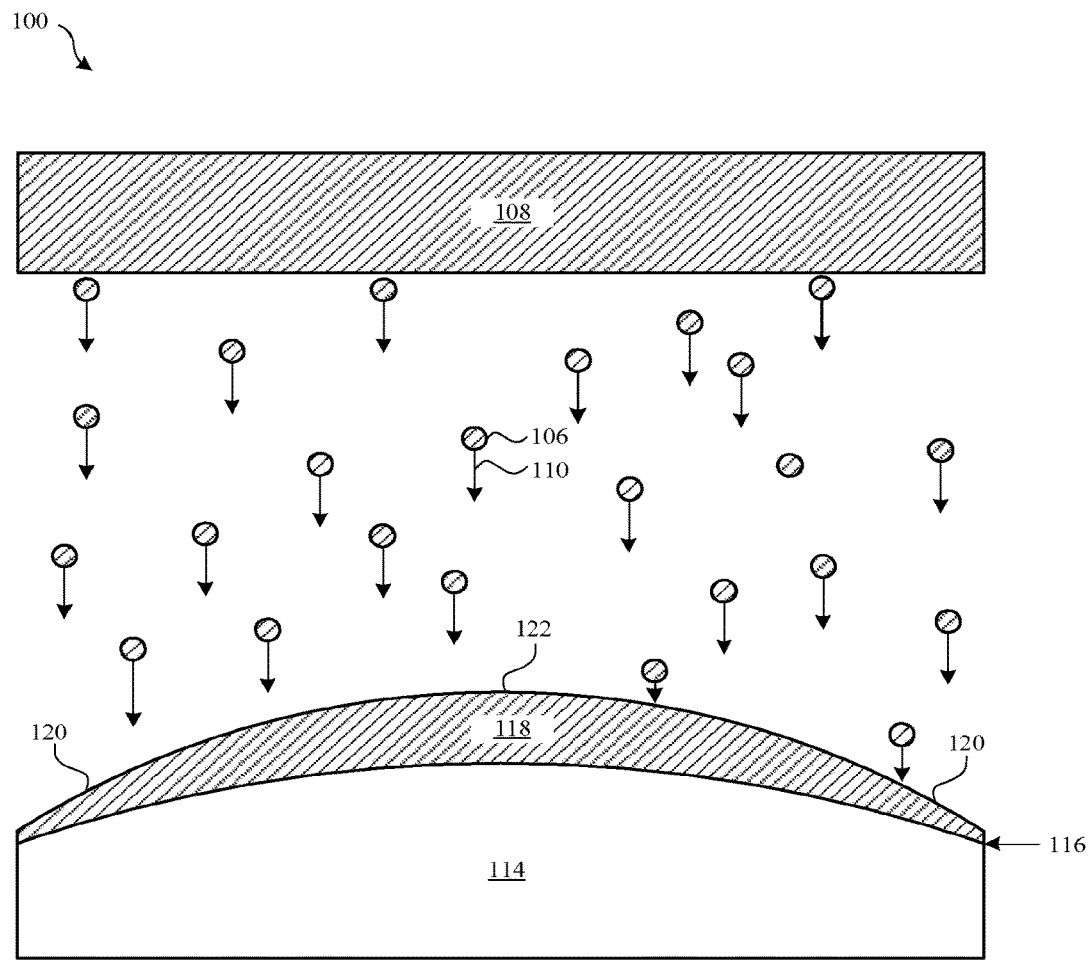
FIG. 1B shows the conventional deposition system of FIG. 1A used to deposit a film on a non-planar surface.

FIG. 1B shows system 100 used to deposit a film on a non-planar surface. Substrate 114 includes surface 116 having a non-planar shape. A non-planar surface is a surface having a three-dimensional geometry or topography that is not substantially planar. Surface 116, in particular, has a curved shape. During a deposition process, particles 106 move toward and deposit onto surface 116 as film 118. As shown, particles 106 move substantially in the same direction with respect to each other, as indicated by arrows 110. Since surface 116 is curved, some particles 106 do not deposit onto surface 116 at a perpendicular direction, particularly at edge portions 120. As a result, film 118 is deposited more thinly at edge portions 120 compared to center portion 122. Thus, film 118 has a non-uniform thickness. If film 118 is a AR coating, this means that center portion 122 will function differently than edge portions 120 with respect to anti-reflective effectiveness. For example, center portion 122 may work more effectively than edge portions 120 with respect to anti-reflective effectiveness. If the deposition process is tuned to deposit more material onto edge portions 120, center portion 122 will be deposited on too thickly. This can result in edge portions 120 of film 118 being more effective than center portion 122 with respect to providing anti-reflective functionality. In addition to reduced anti-reflective functionality, portions of film 118 that are too thick or too thin can take on a color or hue rather than being fully transparent, which can be undesirable in many applications. If multiple layers of film (not shown) are deposited to form the final AR coating, this non-uniformity can be exacerbated resulting in even more disparity between thicknesses of edge portions 120 compared to center portion 122.

Figure 2A:
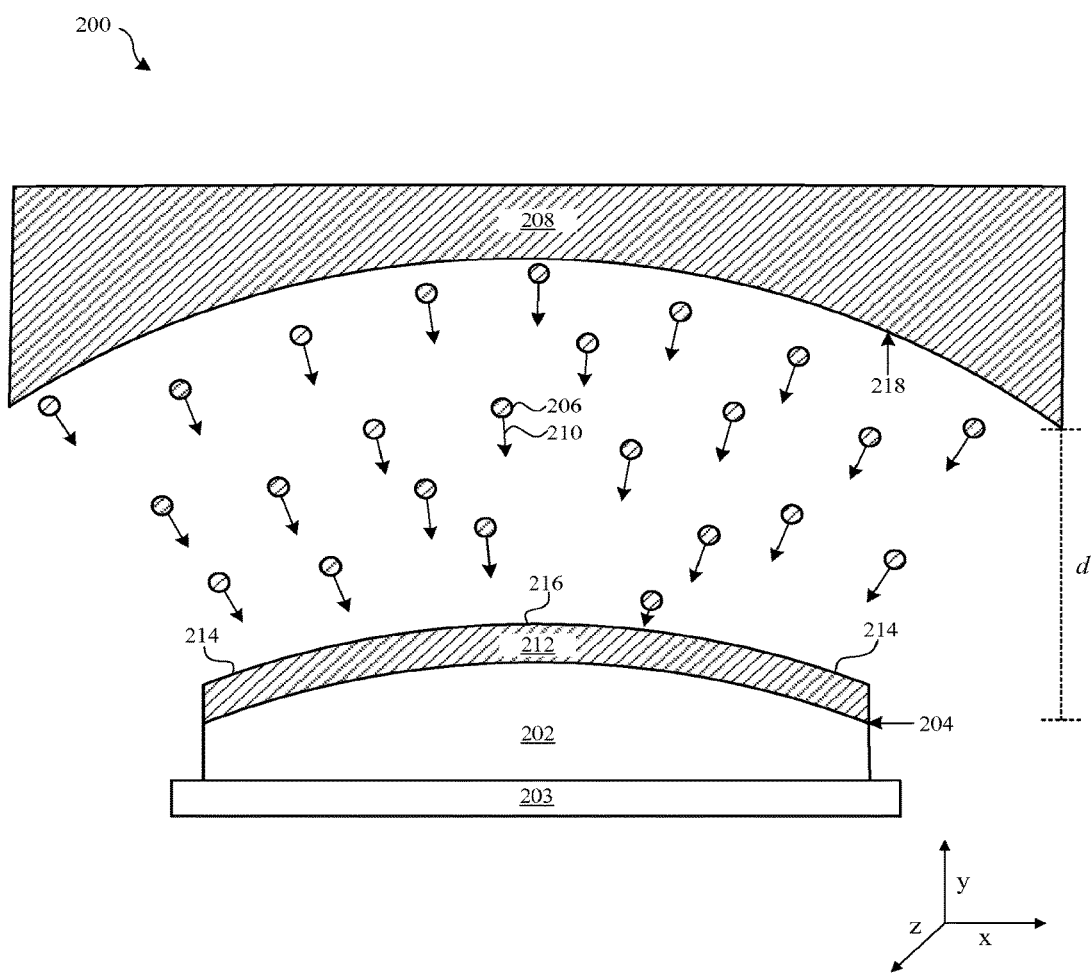
FIG. 2A shows a schematic view of a deposition system used to deposit a film on a non-planar surface in accordance with described embodiments.

Methods and systems described herein can be used to form AR coatings on non-planar surfaces in such a manner such that the resulting AR coatings have substantially uniform thicknesses. FIG. 2A shows a schematic view of system 200 used to form an AR coating on a non-planar surface using a thin film deposition technique in accordance with described embodiments. Substrate 202 can be made of any suitable material. In some embodiments, substrate 202 is a window or lens that is made of glass or plastic, such as for an electronic device or part of an electronic device. Substrate 202 is placed in system 200 and positioned with respect to source 208 such that particles 206 can be deposited onto surface 204 of substrate 202. In some embodiments, substrate 202 is supported and positioned using support 203. Surface 204 is non-planar in that surface 204 has a three-dimensional geometry or topography that is substantially non-planar. In some embodiments, surface 204 has a curved three-dimensional shape. That is, surface 204 can be curved in x, y and z directions. It should be noted that the methods described herein can be used to form an AR coating having any suitable shape, including surfaces having multiple curved portions, planar portions and/or spline shaped portions.

Source 208 has effective surface 218 that corresponds to the surface from which particles 206 are emitted. For example, in sputtering systems effective surface 218 can correspond to a surface of a sputter target. In PECVD systems, effective surface 218 can correspond to a surface of an ion source (e.g., hollow cathode source) that emits reactive chemical species such as ions. According to described embodiments, effective surface 218 has a shape that substantially matches the shape of surface 204 of substrate 202. For example, if surface 204 has a curved shape, effective surface 218 can have the same degree of curvature as surface 204. In this way, effective surface 218 mimics the shape of surface 204 of substrate 202. This configuration allows effective surface 218 to be substantially equidistant to surface 204 at substantially all points along surface 204. The size of effective surface 218 can vary depending on the type of source (e.g., sputter target or ion source) and distance d between source 208 and surface 204 of substrate 202. In general, greater distance d will require effective surface 218 to be larger.

During a deposition process, particles 206 from source 208 move toward and deposit onto substrate 202 in a substantially perpendicular direction with respect to surface 204, as indicated by arrows 210. That is, instead of particles 206 all moving in the same direction, as described above with respect to FIGS. 1A and 1B, particles 206 converge toward surface 204. This arrangement results in film 212 being deposited substantially uniformly and such that the final film 212 has a substantially uniform thickness. That is, the thickness of film 212 is about the same across surface 204, including at center portion 216 and edge portions 214. In some embodiments, substrate and/or source 208 is rotated or otherwise moved during a deposition process to smooth out any non-uniformities. For example, a rotating mechanism (not shown) can be coupled to support 203 such that support 203 and substrate 202 are rotated along the y-axis during a deposition process.

System 200 can be any suitable deposition system. In some embodiments, system 200 is a sputter deposition system where source 208 corresponds to a sputter target from which particles 206 are sputtered. The sputtering can be accomplished by introducing a sputter gas (not shown) such as argon gas, which impinges on sputter target source 208 creating particles 206. The material of a sputter target source 208 will depend upon a desired material of film 212. In some embodiments, the sputter target source 208 includes silicon such that film 212 containing silicon, such as $Si_3N_4$ (silicon nitride) and/or $SiO_2$ (silicon dioxide).

In some embodiments, system 200 is a CVD system, such as a PECVD system. In embodiments where system 200 is a PECVD system, source 208 can correspond to an ion source that forms ions and/or other reactive species within a plasma. The type of reactive species can be controlled by choosing the appropriate reaction gas(es) supplied to source 208. Source 208 breaks up the reactive gas and discharges particles 206 in the form of ions and/or other reactive species. The ions and/or other reactive species can react with other species within the plasma before deposition. For example, silane ($SiH_x$) can be supplied into source 208, where it is broken up into silicon species ($Si_xH_y$). These silicon species can react with a nitrogen-containing gas (e.g., $N_2$, $NH_x$) to form a silicon nitride film. Alternatively, the silicon species can react with an oxygen-containing gas (e.g., $NO_x$) to form a silicon dioxide film. In particular embodiments, source 208 corresponds to a hollow cathode source of a PECVD system. Embodiments including a hollow cathode source will be described in detail below with respect to FIGS. 4 and 5.

Film 212 can be made of any suitable material. In some embodiments, film 212 is made of a material suitable for an AR coating. For example, film 212 can be substantially transparent or translucent such that substrate 202 is visible therethrough. In some applications where the AR coating is applied to a consumer product, the AR coating should be dense and durable enough to substantially avoid damage and delamination during normal use of the consumer product. In particular embodiments, film 212 includes $Si_3N_4$ (silicon nitride), $SiO_2$ (silicon dioxide), $NB_2O_5$, $TiO_2$ (titanium oxide), $TaO_2$ (tantalum oxide) and/or other suitable AR film materials. In some embodiments, one or more subsequently deposited films are deposited on film 212 using one or more subsequent deposition processes, which will be described below with respect to FIGS. 2B and 2C.

Distance d between source 208 and surface 204 of substrate 202 can vary depending on a number of factors including the type of system 200. In general, the larger the distance d, the larger effective surface 218 should be in order to achieve full coverage of surface 204. In embodiments where system 200 is a sputter deposition system and source 208 corresponds to a sputter target, distance d should be large enough to allow room for a sputter gas to sputter off particles 206 from source (sputter target) 208, yet small enough for sufficient sputtering onto surface 204. In embodiments where system 200 is a PECVD system and source 208 corresponds to an ion source (e.g., hollow cathode source), distance d should be large enough to allow adequate formation and discharge of ions and/or other reactive species. Generally, this means distance d for PECVD systems is generally smaller than for sputter deposition systems. In some embodiments, distance d is very small such that particles 206 can be very evenly distributed and deposited onto surface 204. The angle and/or position of surface 204 of substrate 202 should be aligned relative to effective surface 218 to assure that particles 206 arrive at surface 204 substantially uniformly. Generally, the larger distance d is, the more accurately the angle and/or position of surface 204 should be aligned relative to effective surface 218 in order to achieve a uniformly thick film 212.

In some applications, single film 212 is sufficient. In other embodiments, one or more subsequent layers are deposited onto film 212. For example, some AR coatings include multiple layers of thin films having different refractive indexes, such as alternating layers of silicon nitride and silicon dioxide films. As described above, depositing more than one layer on a non-planar surface using conventional deposition techniques can exacerbate any non-uniformity of the final AR coating if the individual films are not deposited uniformly. The methods described herein can be used to deposit more than one layer of film onto a non-planar substrate such that a final multi-layered film has a uniform thickness.

Figure 2B:
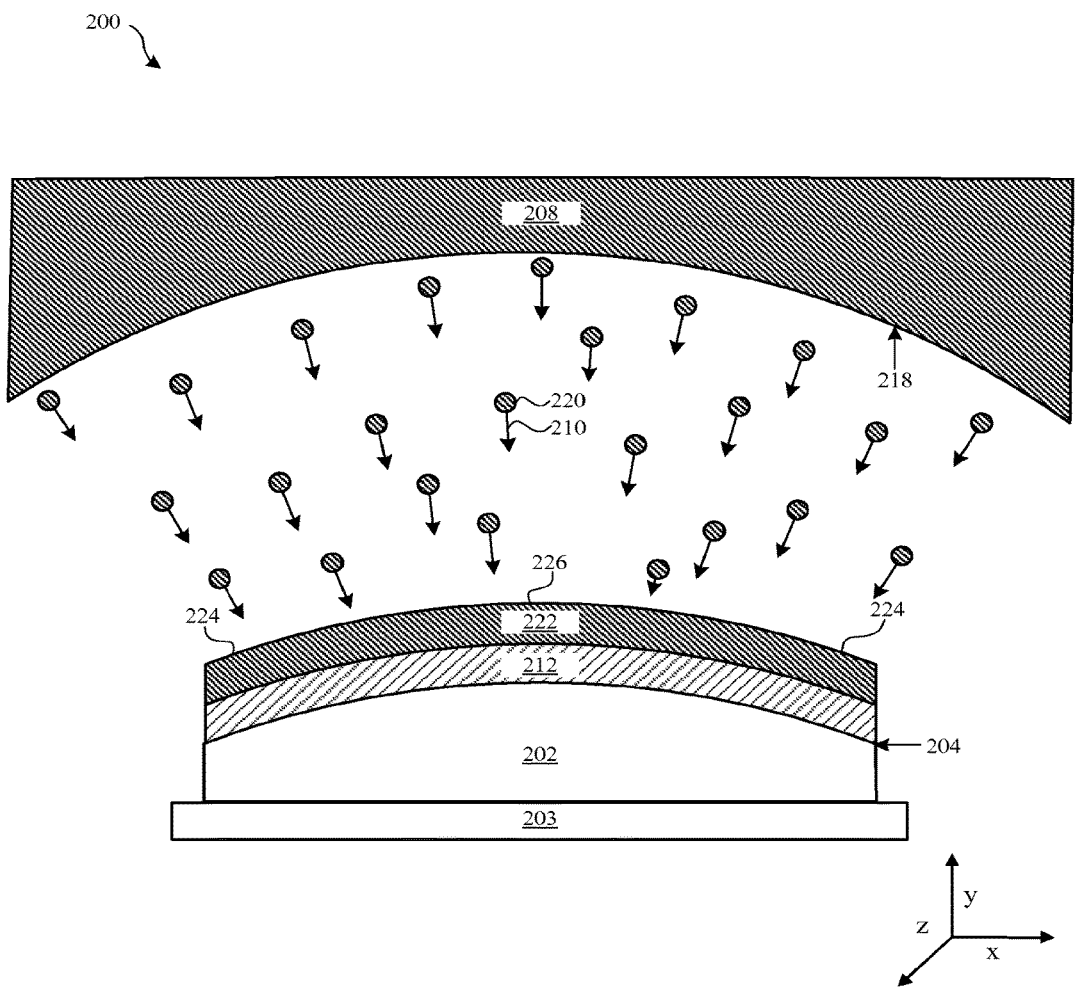
FIG. 2B shows the deposition system of FIG. 2A used to deposit a second film in accordance with described embodiments.

FIG. 2B shows a schematic view of system 200 used to form a multi-layered film coating in accordance with described embodiments. In particular, system 200 is used to deposit a second film 222 onto film 212. Second film 222 can include the same or different material as film 212. For example, film 212 can include silicon dioxide and second film 222 can include silicon nitride. As described above with respect to film 212, the composition of second film 222 can be controlled by choosing the type of material at source 208 and/or gases within system 200. In embodiments where system 200 is a sputter deposition system where source 208 corresponds to a sputter target, process conditions can be changed such that second film 222 has a different chemical composition than film 212. In embodiments where system 200 is a PECVD system with source 208 corresponding to an ion source, the reaction gas that is supplied to source 208 can be changed to correspond to a desired film type. In some cases where films 212 and 222 are made of different materials, source 208 can be purged between deposition processes.

Because source 208 has effective surface 218 having a shape that corresponds to surface 204, particles 220 move toward substrate 202 in a substantially perpendicular direction, as indicated by arrows 210. In this way, second film 222 is uniformly deposited onto film 212. That is, the thickness of second film 222 at edge portions 224 is substantially the same as the thickness of second film 222 at center portion 226. After second film 222 is deposited, any suitable number of films can subsequently deposited onto substrate 202 until a desired number films are deposited.

Figure 2C:
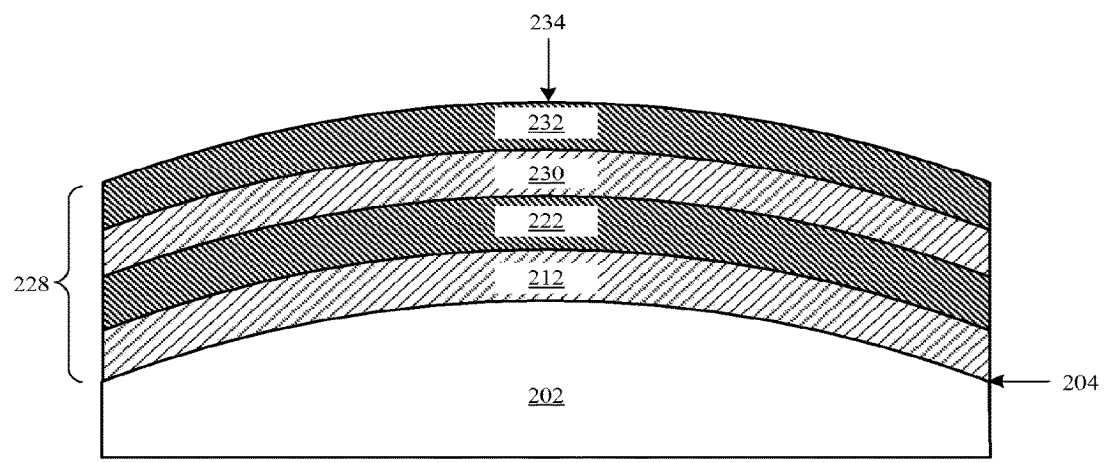
FIG. 2C shows a substrate that has multiple layers of film deposited on a non-planar surface in accordance with described embodiments.

FIG. 2C shows substrate 202 after multiple layers of film are deposited to form multi-layered coating 228. In particular, multi-layered coating 228 includes film 212, second film 222, third film 230 and fourth film 232. Note that the number of film layers indicated in FIG. 2C are representative of only some embodiments and any suitable number of layers can be formed. Film 212, second film 222, third film 230 and fourth film 232 can each be made of the same or different materials. In a particular embodiment, multi-layered coating 228 is an AR coating that includes alternating layers of material having different refractive indexes. This arrangement can allow for the optimal destructive interference of light incident exposed surface 234, thereby reducing glare. For example, film 212 and third film 230 can be composed of silicon dioxide while second film 222 and fourth film 232 are composed of silicon nitride. In some embodiments, silicon nitride/silicon dioxide AR coatings are preferred because silicon nitride is relatively dense, durable and has a relatively high stiffness compared to some other AR coating material alternatives and silicon dioxide bonds well with silicon nitride bond since they each include base silicon matrixes. Thus, the silicon dioxide and silicon nitride film layers will be less prone to pealing from each other when exposed to abrasion forces compared to films made of more dissimilar materials. For at least these reasons, silicon dioxide and silicon nitride AR coatings can be well suited for application on exposed surfaces of consumer products that exposed to a lot of wear and abrasion.

The timing between depositing each of films 212, 222, 230 and 232 can vary depending on the deposition technique use as well as other processing parameters. For example, in sputtering systems, each successive film can generally be deposited very soon after each previous film is deposited. In PECVD systems where films 212, 222, 230 and 232 include different materials, it may be beneficial to allow time for the source to adequately pump down and purge of a first reaction gas before introducing a second type of reaction gas.

Figure 3:
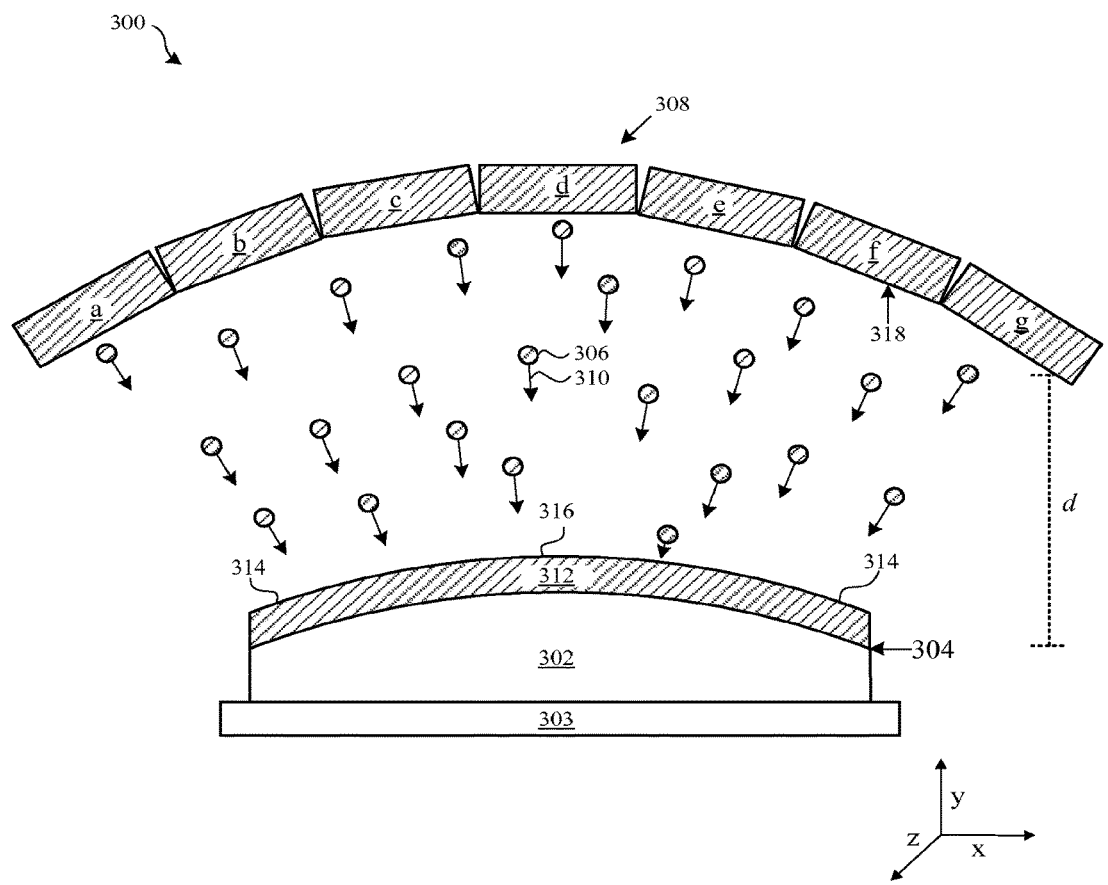
FIG. 3 shows a schematic view of an alternate deposition system used to deposit a film on a non-planar surface in accordance with described embodiments.

FIG. 3 shows a schematic view of system 300 used to form an AR coating on a non-planar surface using an alternative thin film deposition technique in accordance with described embodiments. System 300 is configured to deposit film 312 on surface 304 of substrate 302. System 300 can be any suitable deposition system configured to deposit film 312, such as a sputter deposition system or PECVD system. Surface 304 is non-planar (e.g., curved) and therefore difficult to deposit onto in a uniform fashion using conventional techniques described above. System 300 includes a series of sources 308 having elements a-g that are arranged to have effective surface 318 with a shape that closely corresponds to the shape of surface 304 of substrate 302. In some embodiments, each of elements a-g can have a substantially planar surface but collectively form effective surface 318 that roughly mimics the curved surface 304 of substrate 302. This series of sources 308 may be easier to implement when it is difficult to obtain a single source having a shape that corresponds to surface 304, such as source 208 described above with reference to FIGS. 2A and 2B. In some embodiments, system 300 includes support 303, which supports and positions substrate 302 with respect to series of sources 308.

Series of sources 308 can include any suitable number of elements a-g and are not limited to the number of elements a-g shown. In general, series of sources 308 should have a suitable number of elements a-g for providing film 312 having a sufficiently uniform thickness. This can vary depending on the type of system 300 (e.g., sputter or PECVD), distance d between series of sources 308, the three-dimensional geometry of surface 304, and particular application film uniformity requirements. In embodiments where system 300 is a sputter deposition system, elements a-g can each correspond to a sputter target. In embodiments where system 300 is a PECVD system, elements a-g can each correspond to an ion source. Film 312 can be made of any suitable material, including $Si_3N_4$ (silicon nitride), $SiO_2$ (silicon dioxide), $NB_2O_5$, $TiO_2$ (titanium oxide), $TaO_2$ (tantalum oxide) and/or other suitable AR film materials. System 300 can be used to form subsequent layers of film, similar to described above with reference to FIGS. 2B and 2C.

Figure 4:
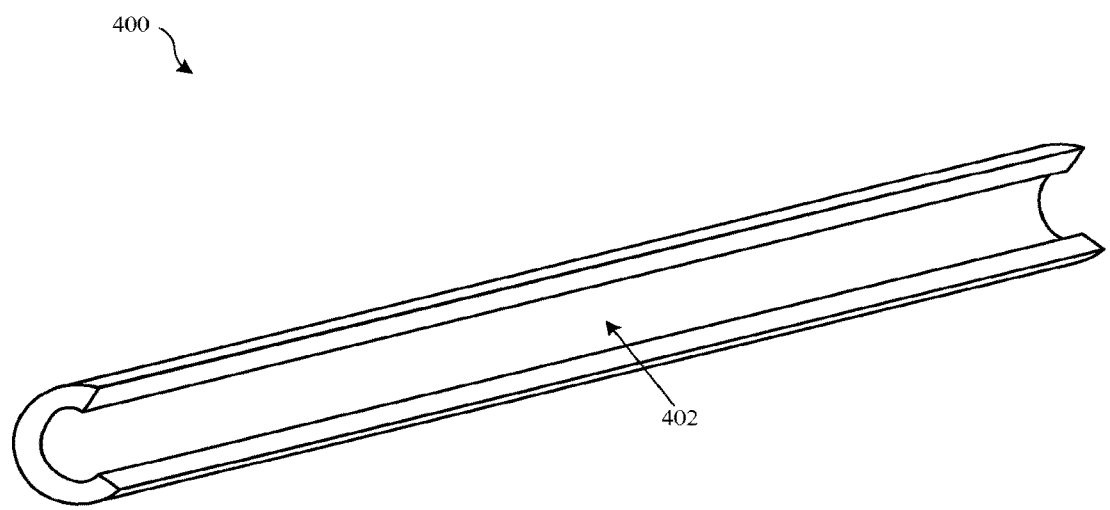
FIG. 4 shows a perspective view of one embodiment of a hollow cathode source in accordance with described embodiments.

As described above, in some embodiments a PECVD system using a hollow cathode source is used to deposit an AR film. FIG. 4 shows a perspective view of one embodiment of a hollow cathode source 400, which has a linear shape. Hollow cathode source 400 has a tubular shape that includes cavity 402. A radio frequency (RF) and/or other current discharge can be applied to hollow cathode source 400 as a gas passes through cavity 402 forming a plasma. For example, a silicon-containing gas, such as a silane gas, can be passed through cavity 402 to form a plasma with silicon-containing ions and reactive species. The ions and reactive species flow toward and deposit conformally onto a substrate surface as a film.

Since hollow cathode source 400 has a substantially linear shape, it can be used to form a film having a substantially uniform surface on a linear or planar surface of a substrate, such as shown in FIG. 1A. However, use of a single linearly shaped hollow cathode source 400 to deposit onto a curved surface can cause the resultant film to have a non-uniform thickness, such as shown in FIG. 1B. To accommodate a non-planar substrate surface, two or more hollow cathode sources 400 can be used in conjunction with other, such as shown in FIG. 3. In particular, the two or more hollow cathode sources 400 can form an effective surface that mimics the non-planar surface of a substrate. This way, the ions and reactive species within the plasma can flow toward the non-planar surface of the substrate in a substantially perpendicular direction with respect to the surface of the substrate, thereby forming a film having a substantially uniform thickness.

Figure 5:
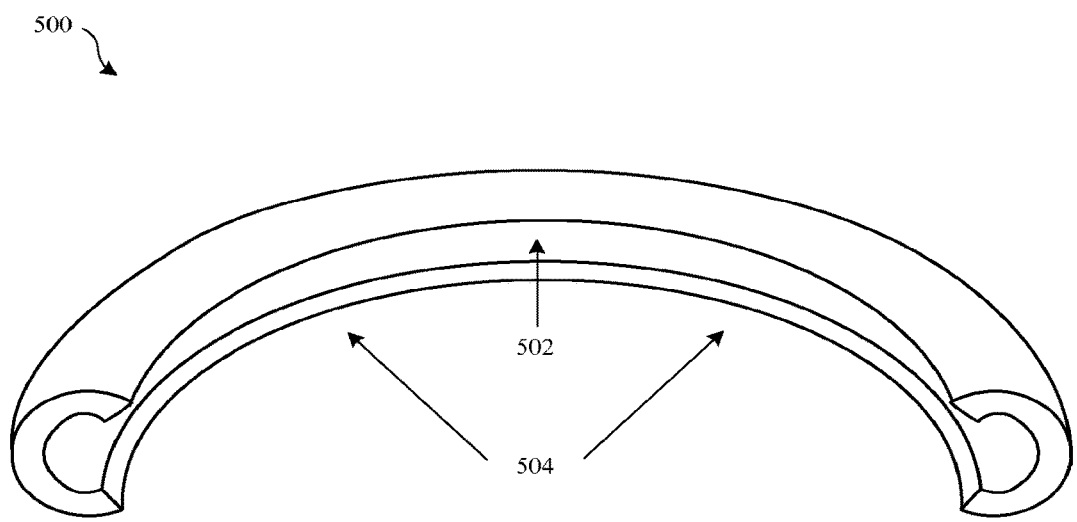
FIG. 5 shows a perspective view of one embodiment of a curved-shaped hollow cathode source in accordance with described embodiments.

In some embodiments, the shape of a hollow cathode source is customized to form an effective surface that mimics a non-planar surface of a substrate. FIG. 5 shows hollow cathode source 500 having a curved shape effective surface 504 in accordance with some embodiments. Hollow cathode source 500 includes cavity 502 where a radio frequency (RF) and/or other current discharge is applied to a gas forming a plasma having ions and/or other reactive chemical species. The curved shape effective surface 504 mimics a shape of curved surface of a substrate, such as shown in FIGS. 2A-2D. The ions and/or other reactive species can then flow toward the curved substrate in a substantially perpendicular direction with respect to the curved substrate surface, thereby forming a film having a substantially uniform thickness.

Note that effective surface 504 of hollow cathode source 500 can have any suitable shape in accordance with a shape of a substrate surface and is not limited to the curved shape shown in FIG. 5. In some embodiments, effective surface 504 mimics a two-dimensional surface of a substrate. In other embodiments, effective surface 504 mimics a three-dimensional surface of a substrate. In some embodiments, two or more hollow cathode sources 500 can have the same or different shaped effective surfaces 504 are combined to mimic the shape of a substrate surface. In some embodiments, one or more non-planar shaped hollow cathode sources 500 are combined with one or more linear shaped hollow cathode sources 400 to mimic a three-dimensional shape of a substrate surface. Some combinations of hollow cathode sources are described below with reference to FIGS. 6-9.

Figure 6A:
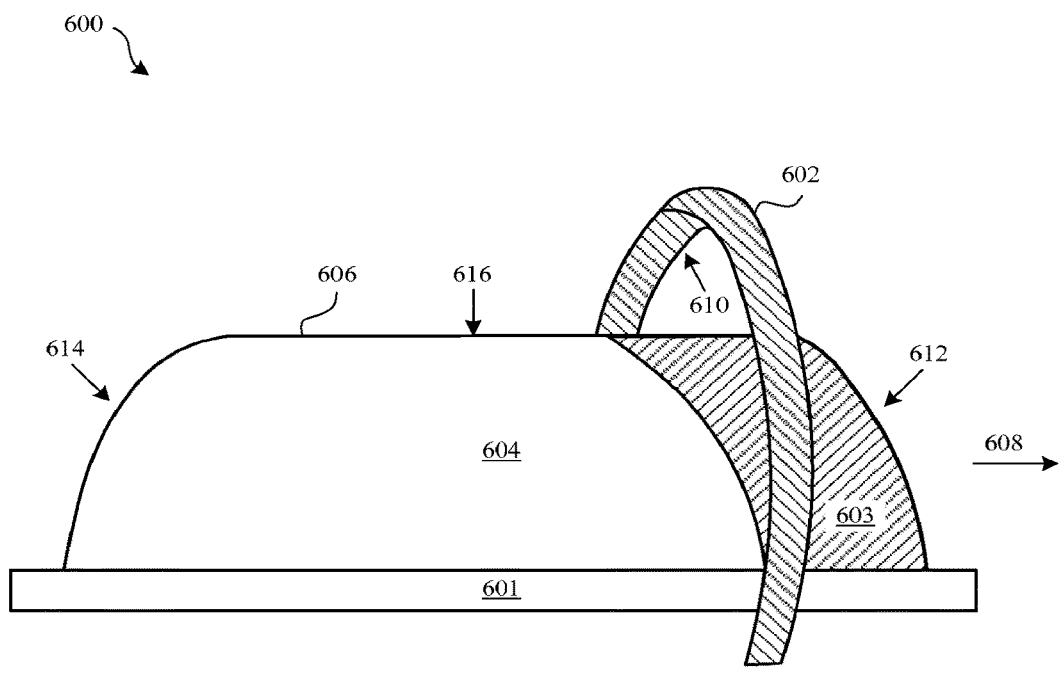
FIGS. 6A and 6B show a schematic view of a hollow cathode system arranged to uniformly deposit one or more films on substrates having non-planar surfaces in accordance with described embodiments.
Figure 6B:
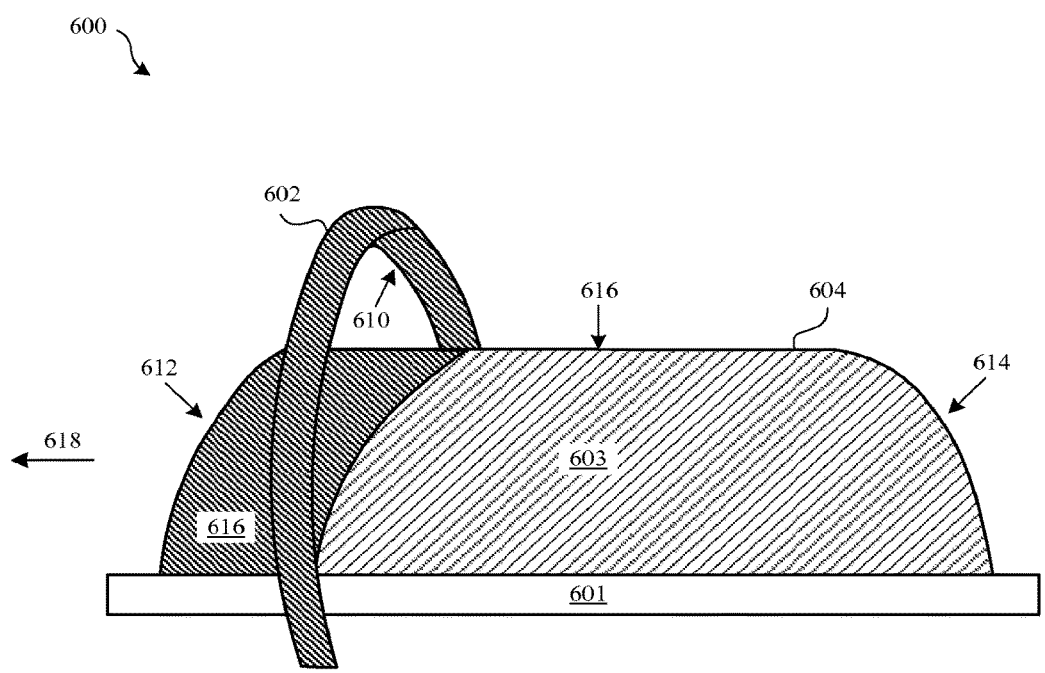

In some applications, a substrate surface has a relatively large three-dimensional surface that is not easily covered using a single hollow cathode source. FIGS. 6A and 6B show hollow cathode systems that can be used as part of a PECVD apparatus in order to uniformly deposit films on substrates having relatively large surfaces. FIG. 6A shows a schematic view of hollow cathode system 600, which includes hollow cathode source 602 for depositing film 603 onto substrate 604. Substrate 604 has surface 606 with a non-planar shape. In some embodiments, substrate 604 is a window or lens for an electronic device. In some embodiments, system 600 includes support 601, which supports and positions substrate 604 relative to hollow cathode source 602. Surface 606 is relatively large in that surface 606 substantially spans in x, y and z directions.

Hollow cathode source 602 has effective surface 610 that has a shape in accordance with a portion of surface 606 of substrate 604. In order to cover surface 606 in its three-dimensional entirety, substrate 604 is translated relative to hollow cathode source 602 during a deposition process, as indicated by arrow 608 (z direction). This way, hollow cathode source 602 can provide a plasma having ions and/or other reactive species sufficiently proximate different regions of surface 606 to deposit film 603 thereon at different times during the deposition process. In some embodiments, support 601 includes a translational mechanism, such as a conveyer belt system, that translates substrate 604 while hollow cathode source 602 remains stationary. In other embodiments, hollow cathode source 602 is translated while substrate 604 remains stationary. In other embodiments, both hollow cathode source 602 and substrate 604 are translated and neither remains stationary.

In some embodiments, the rate at which substrate 604 is translated relative to hollow cathode source 602 is controlled in order to control the rate of deposition onto surface 606. For example, the rate of translation can be tuned such that film 603 has a predetermined thickness. In general, the faster the translation, the thinner film 603 will be. In some embodiments, the rate of translation is consistent throughout a deposition process. In other embodiments, the rate of translation is varied during a deposition process. That is, the rate of translation can be increased or decreased at different points of the deposition process. This technique can be used, for example, to compensate for different regions of surface 606 being different distances from effective surface 610. For example, surface 606 at regions 612 and 614 are farther from effective surface 610 of hollow cathode source 602 compared to region 616 (i.e., in the y and x directions). This varied distance can lead to film 603 having a greater thickness at region 616 compared to regions 612 and 614. To provide film 603 having a uniform thickness at region 616 and regions 612 and 614, the rate of translation can slower when effective surface 610 of hollow cathode source 602 is positioned over regions 612 and 614 and faster when positioned over region 616. This can allow more dwell time and depositing of more material at regions 612 and 614 to compensate for the greater distance from effective surface 610. Resultant film 603 over surface 606 will have a uniform thickness.

According to some embodiments, a flow rate of reaction gas provided to hollow cathode source 602 is varied in order to control the rate of deposition onto surface 606. Different flow rates can be implemented instead of or in addition to varying a translation rate of substrate 604 relative to hollow cathode source 602. In general, higher gas flow rates will result in higher rates of deposition and lower gas flow rates will result in lower rates of deposition. For example, a higher gas flow rate can be applied when effective surface 610 of hollow cathode source 602 is positioned over regions 612 and 614 and lower flow rate when positioned over region 616. This can compensate for the greater distance of regions 612 and 614 from effective surface 610.

As described above, in some applications multiple layers of film are deposited to form an AR coating. After a first deposition process used to deposit film 603 is sufficiently complete, substrate 604 can be either moved to a second hollow cathode source (not shown) to deposit a second film, or substrate 604 can be transferred through hollow cathode source 602 a second time. FIG. 6B shows hollow cathode system 600 during a second deposition process where substrate 604 is transferred through hollow cathode source 602 a second time. The second deposition process deposits second film 616 onto the already deposited film 603. In one embodiment, the second deposition process involves transferring substrate 604 through hollow cathode source 602 in an opposite direction (as indicated by arrow 618) compared to the first deposition process for depositing film 603. In some embodiments, support 601 includes a translational mechanism, such as a conveyer belt system, that translates substrate 604 while hollow cathode source 602. In other embodiments, hollow cathode source 602 is translated while substrate 604 remains stationary.

In some embodiments, second film 616 includes substantially the same material as film 603. In other embodiments, second film 616 includes a different material than film 603. In cases where second film 616 includes a different material, hollow cathode source 602 is configured to form a first type of ions and/or other reactive chemical species when depositing film 603 and a second type of ions and/or other reactive chemical species when depositing second film 616. For example, hollow cathode source 602 can be supplied with a first reaction gas to form film 603 of a silicon dioxide material and a second reaction gas to form second film 616 of a silicon nitride material, or vice versa.

Figure 7:
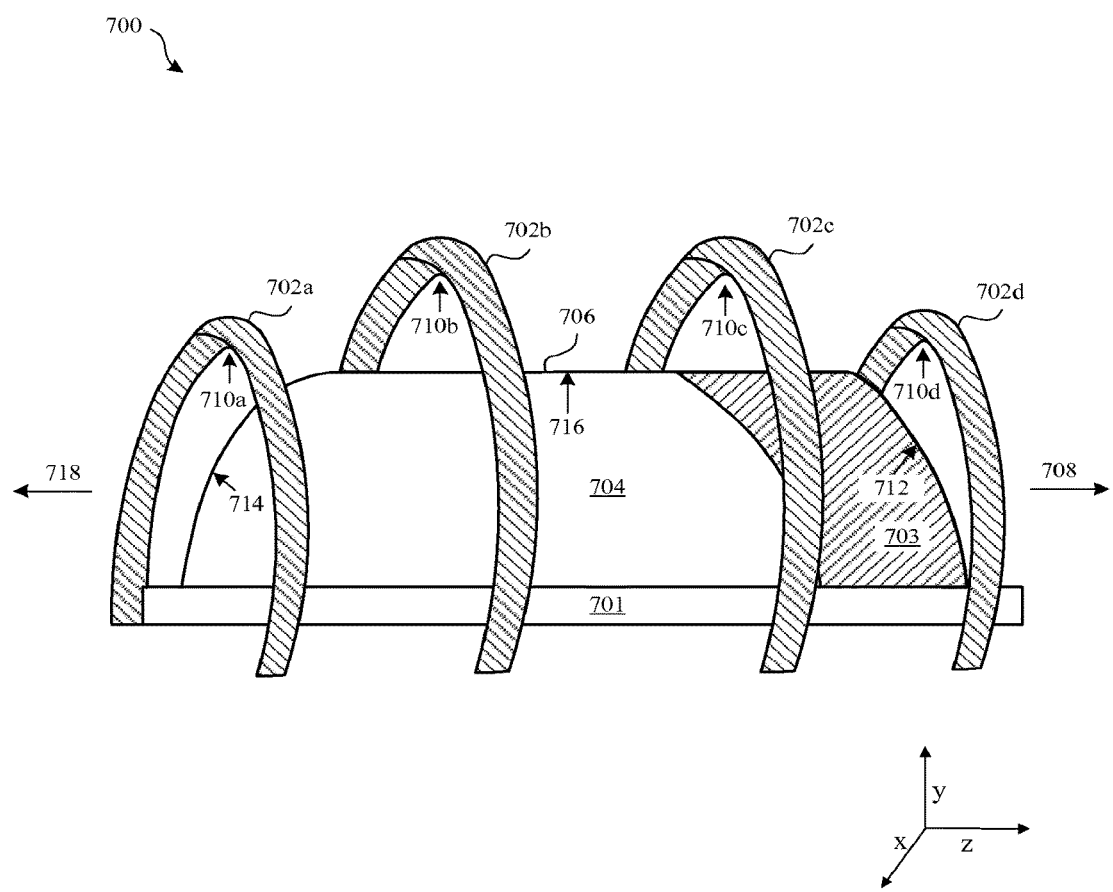
FIG. 7 shows a schematic view of a hollow cathode system arranged in series to uniformly deposit one or more films on substrates having non-planar surfaces in accordance with described embodiments.

In some embodiments, a number of hollow cathode sources are used in order to uniformly cover a three-dimensional surface of a substrate. FIG. 7 shows a schematic view of hollow cathode system 700, which includes hollow cathode sources 702a, 702b, 702c and 702d arranged in series for depositing film 703 onto substrate 704. In some embodiments, system 700 includes support 701 that supports and positions substrate 704 relative to hollow cathode sources 702a, 702b, 702c and 702d. Substrate 704 has three-dimensional surface 606, which includes regions 712, 714 and 716.

Hollow cathode sources 702a, 702b, 702c and 702d each have effective surfaces 710a, 710b, 710c and 710d, respectively, that compensate for the three-dimensional shape of surface 606. In particular, hollow cathode source 702a has an offset position in the x and y directions compared to each of hollow cathode sources 702b and 702c in order to bring hollow cathode source 702a close enough region 714 of surface 706 to provide film 703 the same thickness over region 714 as over region 716. Similarly, hollow cathode source 704d has an offset position in the x and y directions compared to each of hollow cathode sources 702b and 702c in order to bring hollow cathode source 702a close enough to region 712 of surface 706 to provide film 703 the same thickness over region 712 as over region 716. The result is film 703 having a uniform thickness over regions 712, 714 and 716 of surface 706. In some embodiments, effective surfaces 710a, 710b, 710c and 710d are each positioned at the same distance from surface 706. In some embodiments, the flow of gas provided to each of hollow cathode sources 702a, 702b, 702c and 702d is varied in order to control the rate of deposition onto different regions 712, 714 and 716 of surface 706. Note that any suitable number of hollow cathode sources can be used in order to provide a film 703 having a sufficiently uniform thickness.

In some cases, the relative positions of substrate 704 and cathode sources 702a, 702b, 702c and 702d can be changed. For example, support 701 can include a translational mechanism, such as a conveyor belt system, that translates substrate 704 that accurately positions substrate 704 under hollow cathode sources 702a, 702b, 702c and 702d for a deposition process and removes substrate 704 after a deposition process. In one embodiment, substrate 704 is translated in directions 708 and 718. For example, substrate 704 can be translated in direction 708 before a deposition process and then translated in direction 718 after the deposition process is complete. In other embodiments, substrate is translated in direction 708 before and after a deposition process. In some embodiments, system 700 is used to deposit a second film (not shown) onto film 703.

Figure 8:
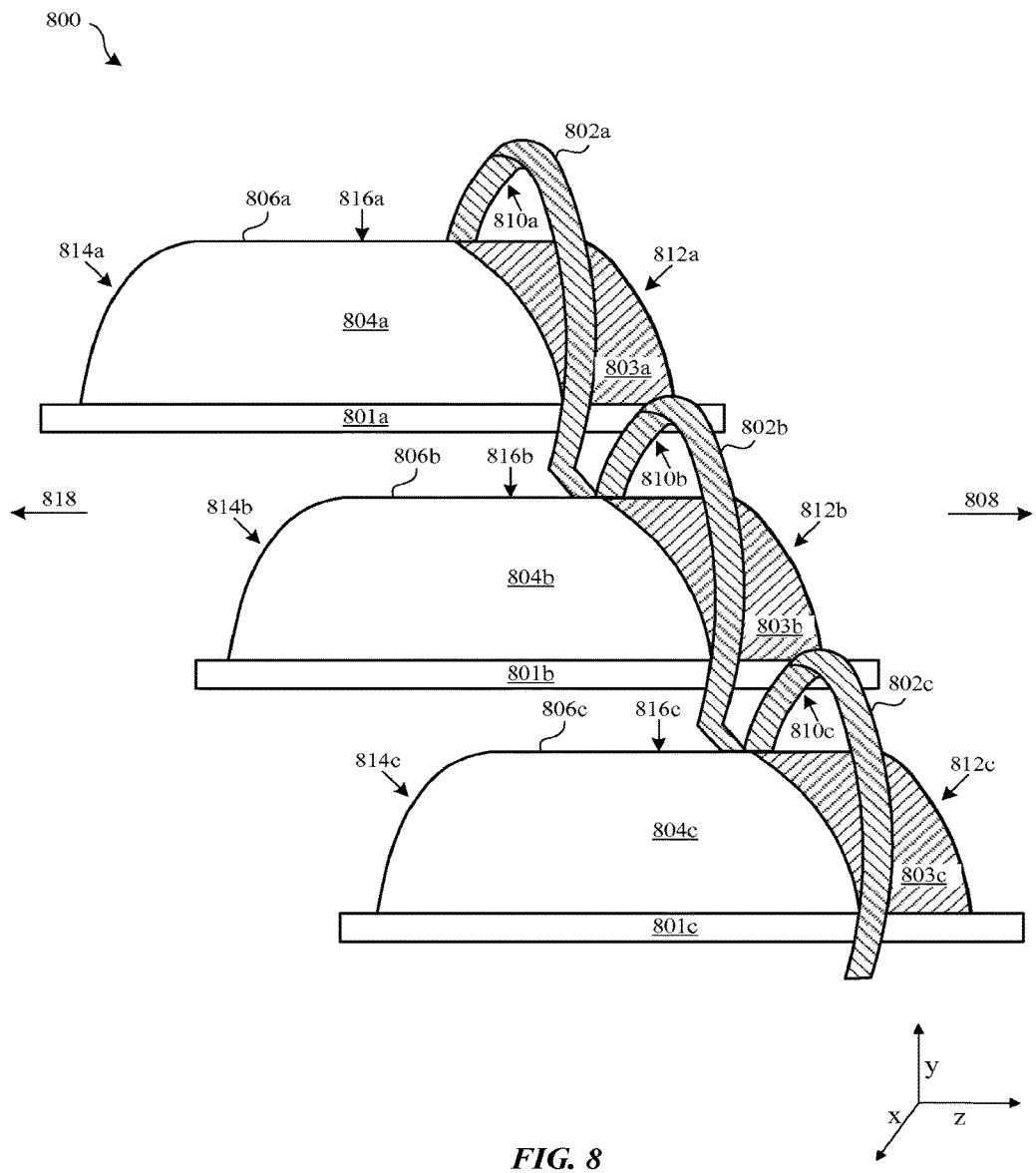
FIG. 8 shows a schematic view of a hollow cathode system arranged in parallel to uniformly deposit one or more films on substrates having non-planar surfaces in accordance with described embodiments.

According to some embodiments, multiple substrates are processed simultaneously, which may be beneficial in some manufacturing situations where throughput is an important factor. FIG. 8 shows a schematic view of hollow cathode system 800, which includes hollow cathode sources 802a, 802b and 802c arranged in parallel for depositing films 803a, 803b and 803c onto substrates 804a, 804b and 804c, respectively. In some embodiments, system 800 includes supports 801a, 801b and 801c, which support and position substrates 804a, 804b and 804c, respectively. Hollow cathode source 802a has effective surface 810a that is in accordance with curved surface 806a of substrate 804a. Hollow cathode source 802b has effective surface 810b that is in accordance with curved surface 806b of substrate 804b. Hollow cathode source 802c has effective surface 810c that is in accordance with curved surface 806c of substrate 804c. In some embodiments, the shapes of surfaces 806a, 806b and 806c substrates 804a, 804b and 804c are the same. In other embodiments, one or more of surfaces 806a, 806b and 806c have different shapes.

As shown, hollow cathode sources 802a, 802b and 802c are positioned in parallel such that substrates 804a, 804b and 804c can be deposited onto simultaneously. For example, a translation mechanism can be used to translate either substrates 804a, 804b and 804c or cathode sources 802a, 802b and 802c in direction 808. In some embodiments, hollow cathode sources 802a, 802b and 802c are all part of a single hollow cathode source that has curved portions to accommodate each of substrates 804a, 804b and 804c. If hollow cathode sources 802a, 802b and 802c are all part of a single hollow cathode source, a single gas source can be used to supply gas to hollow cathode sources 802a, 802b and 802c. In other embodiments, hollow cathode sources 802a, 802b and 802c are each separate hollow cathode sources that are supplied gas by different gas sources. In some embodiments, system 800 is used to deposit second films (not shown) onto films 803a, 803b and 803c by, for example, translating either 804a, 804b and 804c or hollow cathode sources 802a, 802b and 802c in direction 818 and changing the source gases supplied to hollow cathode sources 802a, 802b and 802c.

As described above with respect to FIGS. 6A and 6B, the rate of relative translation of substrates 804a, 804b and 804c with respect to hollow cathode sources 802a, 802b and 802c can be varied in order to compensate for the three-dimensional variation of surfaces 806a, 806b and 806c and in order to provide films 803a, 803b and 803c having uniform thicknesses. For example, the rate of translation can slower when effective surfaces 810a, 810b and 810c are positioned over regions that are farther away, (e.g., regions 612a, 612b, and 612c and 614a, 614b, and 614c) and faster when positioned over regions that are closer (e.g., regions 616a, 616b, and 616c). Alternatively or in addition to varying a translation rate, a flow rate of reaction gas(es) provided to hollow cathode sources 802a, 802b and 802c is varied in order to control the rate of deposition onto different regions of surfaces 806a, 806b and 806c, respectively. In some embodiments, system 800 is used to deposit second films (not shown) onto films 803a, 803b and 803c.

Figure 9:
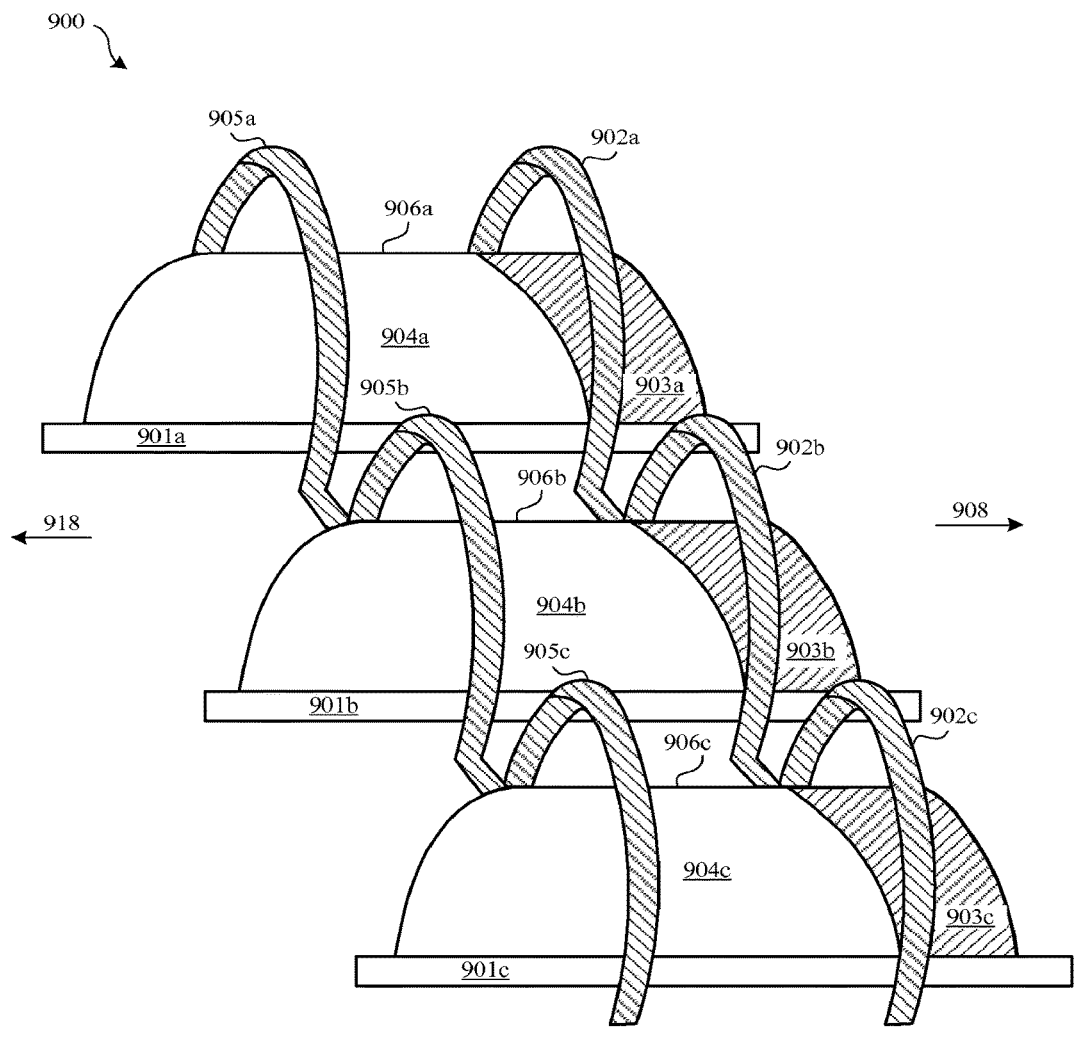
FIG. 9 shows a schematic view of a hollow cathode system having hollow cathode sources arranged in series and in parallel in accordance with described embodiments.

According to some embodiments, a hollow cathode system includes a number of hollow cathodes sources arranged in series, such as described above with reference to FIG. 7, as well as a number of hollow cathode sources arranged in parallel, such as described above with reference to FIG. 8. FIG. 9 shows a schematic view of system 900, which includes multiple hollow cathodes for depositing films 903a, 903b and 903c on substrates 904a, 904b and 904c, respectively. System 900 includes a first set of parallel hollow cathode sources 902a, 902b and 902c and a second set of parallel hollow cathode sources 905a, 905b and 905c. Hollow cathode sources 902a and 905a can have an effective surface with a shape in accordance with a curved portion of surface 906a of substrate 904a. Hollow cathode sources 902b and 905b can have an effective surface with a shape in accordance with a curved portion of surface 906b of substrate 904b. Hollow cathode sources 902c and 905c can have an effective surface with a shape in accordance with a curved portion of surface 906c of substrate 904c. In some embodiments, surfaces 906a, 906b and 906c have substantially the same shape. In other embodiments, surfaces 906a, 906b and 906c have different shapes.

Substrates 904a, 904b and 904c can be positioned on supports 901a, 901b and 901c, respectively. In some embodiments, supports 901a, 901b and 901c include a translational mechanism, such as a conveyor belt system, for translating substrates 904*a*, 904*b* and 904*c*, respectively, in directions 908 and/or 918. It should be understood that the number and arrangement of hollow cathode sources shown in FIGS. 7, 8 and 9 are representative of some embodiments and are not meant to represent all possible numbers and configurations. In addition, the substrate surface shapes and corresponding effective surface shapes of the hollow cathode sources shown in FIGS. 7, 8 and 9 are not meant to represent all possible shapes of substrate surfaces and effective surface shapes. For example, a substrate can have a surface with one or more curved portions and one or more substantially planar portions. The hollow cathode sources can mimic an entire substrate surface shape or portions of the substrate surface.

Figure 10:
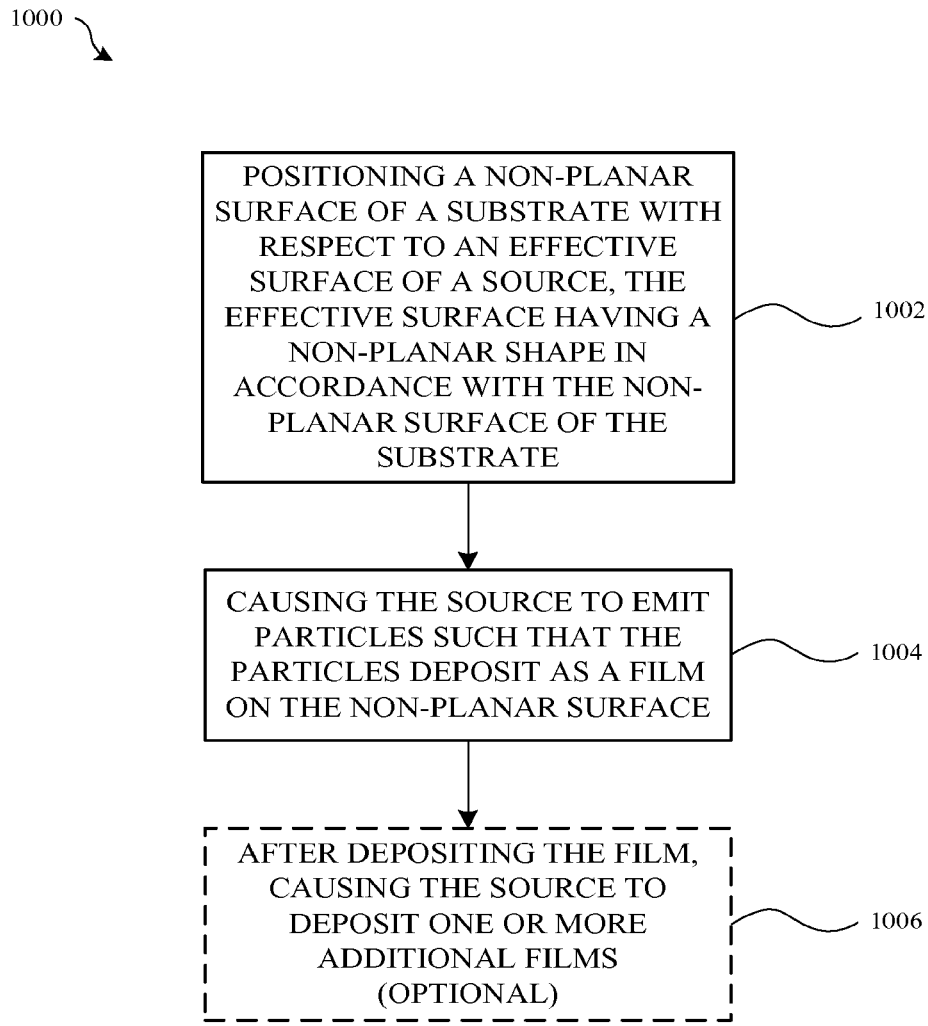
FIG. 10 shows a flowchart that indicates a process for depositing a film on a surface of a substrate in accordance with described embodiments.

FIG. 10 shows flowchart 1000 indicating a high level process for depositing a film having a uniform thickness on a surface of a substrate in accordance with described embodiments. At 1002, a substrate having a non-planar surface is positioned with respect to an effective surface of a source of a deposition system. The effective surface has a non-planar shape in accordance with the non-planar surface of the substrate. A non-planar surface is defined as having a three-dimensional surface geometry or topography that is not substantially planar. The non-planar surface of the substrate can encompass substantially an entire surface of the substrate or can include one or more regions of the substrate. In some embodiments, the non-planar surface has at least one curved region. In some embodiments, the substrate is a curved surface of a window or lens for an electronic device. In some embodiments, the film is an AR coating or one layer of a multi-layered AR coating.

The source can be any suitable deposition source. For example, in a sputter deposition system, the source can correspond to a sputter target. In a PECVD system, the source can correspond to an ion source, such as a hollow cathode source. The non-planar surface of the substrate can be positioned or aligned with respect to the effective such that particles emitted from the source deposit as a film on the non-planar surface. In some embodiments, the substrate is supported and/or positioned using a support. In some embodiments the support includes a translational mechanism configured to translate the substrate with respect to the source. In some embodiments, the translational mechanism is configured to translate the substrate before and after a deposition process. In some embodiments, the translational mechanism is configured to additionally translate the substrate during one or more deposition processes.

At 1004, the source is caused to emit particles such that the particles deposit as a film on the non-planar surface. The particles can be any suitable material capable of forming a film on the substrate. In a sputter deposition system, the particles can correspond to material sputtered from the sputter target. In a PECVD system, the particles can correspond to ions and/or other reactive chemical species of a plasma. Since the effective surface has a non-planar shape in accordance with the non-planar surface of the substrate, the film has a substantially uniform thickness.

At 1006, after depositing the film, the source is optionally used to deposit one or more additional films, forming a coating having multiple layers of film on the non-planar surface of the substrate. In some embodiments, the multiple layers of film make up an AR coating. In one embodiment, the AR coating includes alternating films of $Si_3N_4$ and $SiO_2$ films. In other embodiments, a different source is used to form the one or more additional films. In some embodiments, the same source is used to form the one or more additional films.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not target to be exhaustive or to limit the embodiments to the precise forms disclosed. It will be apparent to one of ordinary skill in the art that many modifications and variations are possible in view of the above teachings.

What is claimed is:

1. A method of depositing an anti-reflective coating on a curved surface of a lens using a plasma enhanced vapor deposition system, the method comprising:
   with a series of source elements of the plasma enhanced vapor deposition system, generating a plasma, wherein each of the source elements has a surface that faces the lens and wherein the surface has a curved shape that corresponds to the curved surface of the lens;
   with the series of source elements, depositing ions from the plasma on the curved surface of the lens to form the anti-reflective coating; and
   with a translation mechanism, while depositing the ions, translating the lens with respect to the series of source elements at a rate selected to control the thickness of the anti-reflective coating across the curved surface of the lens.

2. The method defined in claim 1 further comprising:
   supplying a reaction gas to the series of source elements; and
   with the series of source elements, discharging the plasma.

3. The method defined in claim 1 wherein a distance between the surface of each of the source elements and the curved surface of the lens is the same for all of the source elements.

4. The method defined in claim 1 wherein the anti-reflective coating includes one or more of Si3N4, SiO2, NB2O5, TiO2, and TaO2.

5. The method defined in claim 1 further comprising:
   after forming the anti-reflective coating on the curved surface, forming an additional coating on the curved surface.

6. The method defined in claim 1 method further comprising:
   with an additional series of source elements, generating additional plasma; and
   with the additional series of source elements, depositing ions from the additional plasma on the curved surface of the lens to form an additional anti-reflective coating.

7. The method defined in claim 6 wherein the anti-reflective coating and the additional anti-reflective coating are formed simultaneously.

8. The method defined in claim 1 wherein the anti-reflective coating is an inorganic coating.

9. A method of depositing a coating on a curved surface of a substrate using a plasma enhanced vapor deposition system, the method comprising:
   aligning the substrate with a hollow cathode source element of the plasma enhanced vapor deposition system, wherein the hollow cathode source element has a curved surface that matches the curved surface of the substrate;
   with the hollow cathode source element, generating a plasma;

with the hollow cathode source element, depositing ions from the plasma on the curved surface of the substrate to form the coating; and while depositing the ions from the plasma, translating the substrate with respect to the hollow cathode source element.

10. The method defined in claim 9 wherein translating the substrate with respect to the hollow cathode source element comprises translating the substrate perpendicular to a longitudinal axis of the hollow cathode source element.

11. The method defined in claim 9 wherein the coating is an inorganic coating.

12. The method defined in claim 11 wherein the inorganic coating includes one or more of $Si_3N_4$, $SiO_2$, $NB_2O_5$, $TiO_2$, and $TaO_2$.

13. The method defined in claim 11 wherein the inorganic coating is an antireflective coating.

14. The method defined in claim 9 wherein the substrate is a lens.

15. A method of depositing an anti-reflective coating on a curved surface of a lens using a plasma enhanced vapor deposition system, wherein the plasma enhanced vapor deposition system comprises first and second hollow cathode plasma sources, the method comprising:

placing the lens on a support such that the curved surface of the lens faces the first and second hollow cathode plasma sources, wherein each of the first and second hollow cathode plasma sources has a surface with a shape that matches the curved surface of the lens;

with the first and second hollow cathode plasma sources, depositing ions on the curved surface of the lens to form the anti-reflective coating; and while depositing the ions, translating the support with respect to the first and second hollow cathode plasma sources at a rate selected to control a thickness of the anti-reflective coating across the lens.

16. The method defined in claim 15 wherein the plasma enhanced vapor deposition system comprises a third hollow cathode plasma source, the method further comprising:

placing an additional lens on an additional support such that a curved surface of the additional lens faces the third hollow cathode plasma source, wherein the third hollow cathode plasma source has a surface with a shape that matches the curved surface of the additional lens;

with the third hollow cathode plasma source, depositing ions on the curved surface of the additional lens to form an additional anti-reflective coating; and while depositing the ions on the curved surface of the additional lens, translating the additional support with respect to the third hollow cathode plasma source, wherein the support and the additional support are translated in parallel.

17. The method defined in claim 16 wherein depositing ions on the curved surface of the additional lens with the third hollow cathode plasma source comprises depositing ions on the curved surface of the additional lens with the third hollow cathode plasma source while depositing ions on the curved surface of the lens with the first and second hollow cathode plasma sources.

18. The method defined in claim 15 wherein the anti-reflective coating is an inorganic coating.

* * * * *